(12) United States Patent
Nomura

(10) Patent No.: US 7,842,910 B2
(45) Date of Patent: Nov. 30, 2010

(54) CONTROL OF LIGHT EMITTING AND RECEIVING ELEMENTS OF OPTICAL MODULE BASED ON PROPERTY DATA ASSOCIATED WITH ELEMENTS AS STORED ON MEMORY CIRCUIT OF OPTICAL MODULE

(75) Inventor: Rintaro Nomura, Tokyo (JP)

(73) Assignee: NEC Corporation, Tokyo (JP)

( * ) Notice: Subject to any disclaimer, the term of this patent is extended or adjusted under 35 U.S.C. 154(b) by 194 days.

(21) Appl. No.: 12/170,277

(22) Filed: Jul. 9, 2008

(65) Prior Publication Data
US 2009/0184233 A1      Jul. 23, 2009

(30) Foreign Application Priority Data
Jul. 17, 2007    (JP)    ............................. 2007-185378

(51) Int. Cl.
*H01J 7/24*   (2006.01)
*G01J 1/32*   (2006.01)
(52) U.S. Cl. .................................. 250/214 R; 250/205
(58) Field of Classification Search ................. 250/221, 250/239, 205, 214 R, 238, 201.1, 214.1; 315/154, 315/307, 291, 149–152, 158; 362/800; 372/20, 372/29.01, 29.011, 29.014
See application file for complete search history.

(56) References Cited

U.S. PATENT DOCUMENTS

| | | | | |
|---|---|---|---|---|
| 4,819,241 A * | 4/1989 | Nagano | .................... | 372/38.03 |
| 7,064,733 B2 * | 6/2006 | Cok et al. | ..................... | 345/76 |
| 7,230,222 B2 * | 6/2007 | Cheng et al. | ................. | 250/205 |
| 7,423,626 B2 * | 9/2008 | Yamamoto et al. | ........... | 345/102 |
| 2007/0280314 A1 * | 12/2007 | Keh et al. | .................. | 372/38.02 |
| 2008/0128587 A1 * | 6/2008 | Lyu et al. | ..................... | 250/205 |

FOREIGN PATENT DOCUMENTS

| | | |
|---|---|---|
| JP | 2002084235 A | 3/2002 |
| JP | 2006156808 A | 6/2006 |
| WO | 2002069464 A1 | 9/2002 |

* cited by examiner

*Primary Examiner*—Thanh X Luu
*Assistant Examiner*—Pascal M Bui-Pho

(57) ABSTRACT

The present invention provides an optical module, a host board, and a method of manufacturing the host board, where the number of man-hours required for manufacture has been reduced. Accordingly, the present invention need not have such type of optical transceiver module as the conventional host board since the host board on which the optical module has been mounted may automatically perform a control corresponding to property data of a light emitting element and a light receiving element by mounting a memory circuit on the optical module. As a result, it may be achieved to provide an optical module, a host board, and a method of manufacturing the host board, where the number of man-hours required for manufacture has been reduced.

5 Claims, 8 Drawing Sheets

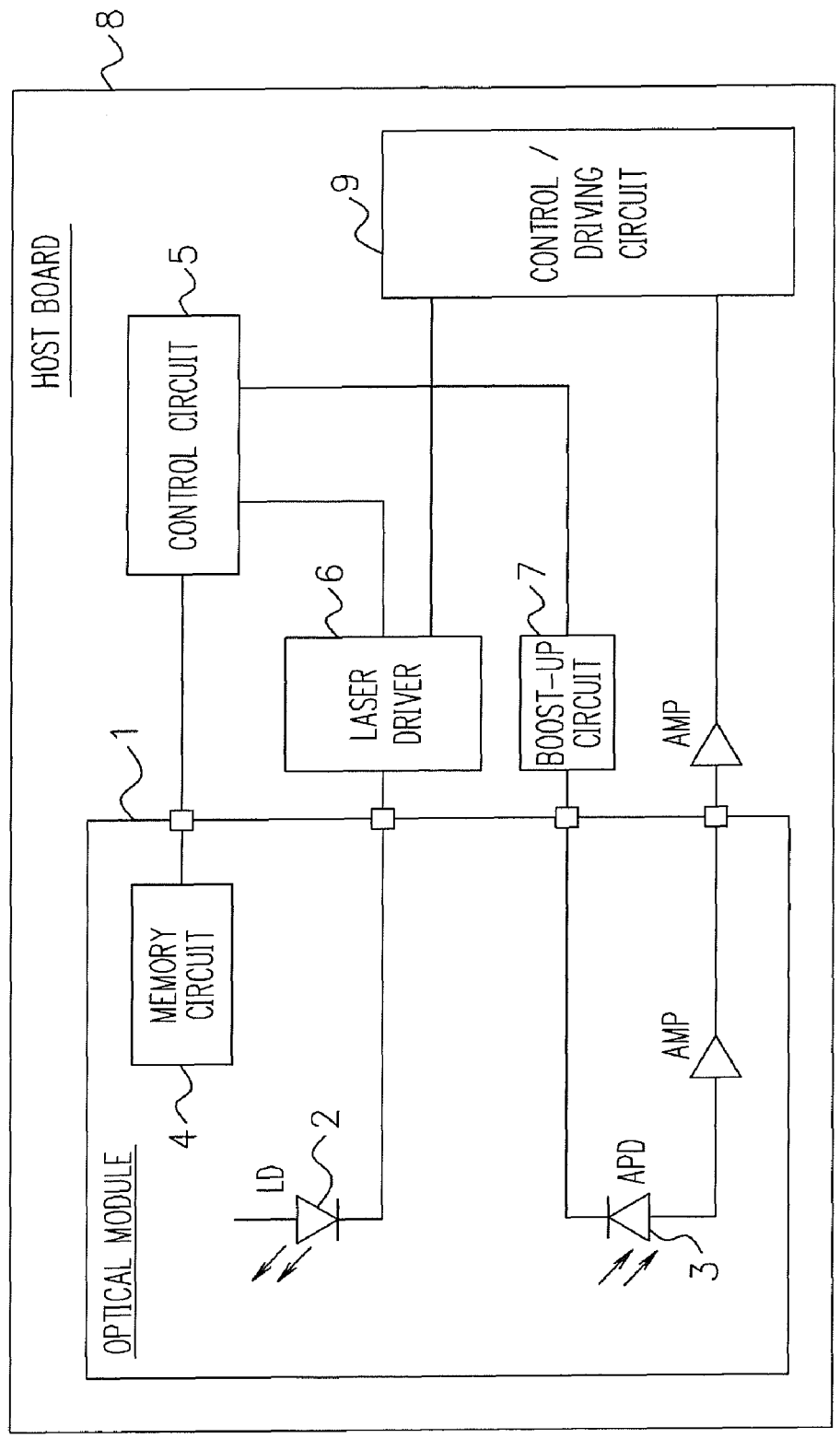
F I G. 1

F I G. 4

```
MEMORY AREA

η(T1),  I(T1),  Imon(T1), Pa
η(T2),  I(T2),  Imon(T2), Pa
η(T3),  I(T3),  Imon(T3), Pa
. . . .
. . . .

S(T1), Vbr(T1)
S(T2), Vbr(T2)
S(T3), Vbr(T3)
. . . .
. . . .
```

F I G. 5

```
MEMORY AREA

η(T)
Ith(T)
Imon(T)
. . . .
. . . .
S(T)
Vbr(T)

. . . .
. . . .
```

F I G. 9

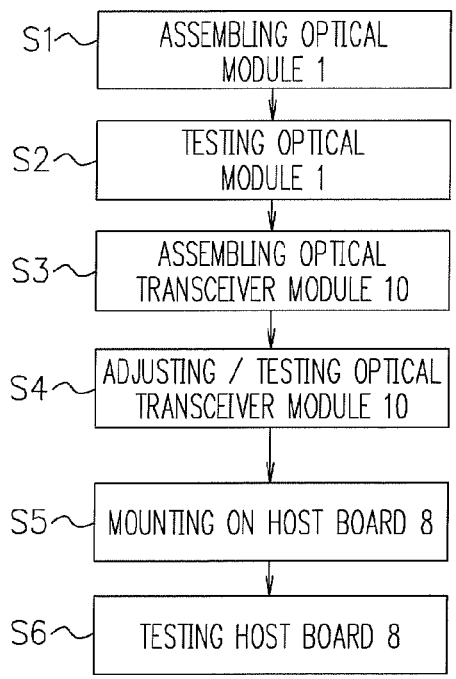

FLOW OF ASSEMBLING, ADJUSTING, AND TESTING

- S1: ASSEMBLING OPTICAL MODULE 1
- S2: TESTING OPTICAL MODULE 1
- S3: ASSEMBLING OPTICAL TRANSCEIVER MODULE 10
- S4: ADJUSTING / TESTING OPTICAL TRANSCEIVER MODULE 10
- S5: MOUNTING ON HOST BOARD 8
- S6: TESTING HOST BOARD 8

THE NUMBER OF MAN-HOURS REQUIRED

- ASSEMBLING OF OPTICAL MODULE 1 : A
- TESTING OF OPTICAL MODULE 1 : B
- ASSEMBLING OF OPTICAL TRANSCEIVER MODULE 10 : C
- ADJUSTING OF OPTICAL TRANSCEIVER MODULE 10 : D
- TESTING OF OPTICAL TRANSCEIVER MODULE 10 : E
- MOUNTING ON HOST BOARD 8 : F
- TESTING OF HOST BOARD 8 : G

F I G. 10

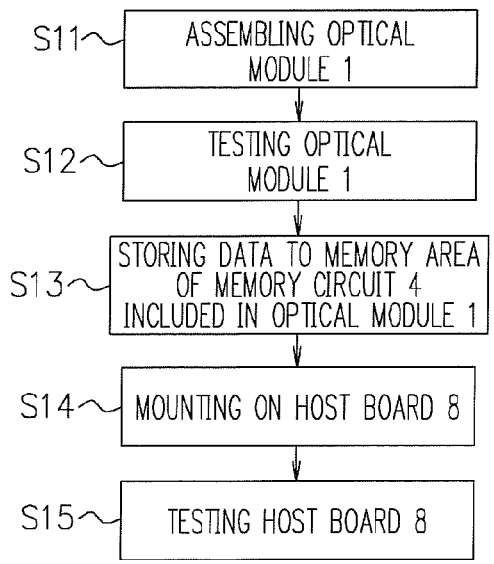

FLOW OF ASSEMBLING, ADJUSTING, AND TESTING

- S11: ASSEMBLING OPTICAL MODULE 1
- S12: TESTING OPTICAL MODULE 1
- S13: STORING DATA TO MEMORY AREA OF MEMORY CIRCUIT 4 INCLUDED IN OPTICAL MODULE 1
- S14: MOUNTING ON HOST BOARD 8
- S15: TESTING HOST BOARD 8

THE NUMBER OF MAN-HOURS REQUIRED

- ASSEMBLING OF OPTICAL MODULE 1 : A
- TESTING OF OPTICAL MODULE 1 : B
- STORING DATA : Z
- MOUNTING ON HOST BOARD 8 : F
- TESTING OF HOST BOARD 8 : G

CONTROL OF LIGHT EMITTING AND RECEIVING ELEMENTS OF OPTICAL MODULE BASED ON PROPERTY DATA ASSOCIATED WITH ELEMENTS AS STORED ON MEMORY CIRCUIT OF OPTICAL MODULE

INCORPORATION BY REFERENCE

This application is based upon and claims the benefit of priority from Japanese patent application No. 2007-185378, filed on Jul. 17, 2007, the disclosure of which is incorporated herein in its entirety by reference.

BACKGROUND OF THE INVENTION

1. Field of the Invention

The present invention is related to an optical module, a host board, and a method of manufacturing the host board.

2. Description of Related Art

FIG. 6 shows a configuration of a host board related to the present invention.

In general, an optical transceiver module 10 includes an optical module 1 encompassing a laser diode (LD) 2 and an avalanche photo diode (APD) 3, a control circuit 5, an LD driving circuit (Laser Driver) 6, an APD driving circuit (boost-up circuit) 7, an amplifying circuit (AMP) or the like.

The optical transceiver module 10 includes a circuit (a first control circuit) 5 that compensates for temperature properties of the LD 2 and APD 3. The transceiver module 10 has been adjusted so that desired properties may be attained by obtaining the temperature properties previously.

A user can perform electrical-to-optical conversion only by mounting the optical transceiver module 10 on a HOST BOARD (hereinafter, referred to as "host board") 8 and inputting an electrical signal from a control/driving circuit (a second control circuit) 9 located on the host board to the optical transceiver module 10, and therefore, optical elements, such as LD 2 or APD 3, might be handled very easily. And, the LD 2 and APD 3, properties of which greatly vary with temperature, may be controlled by the control circuit 5 embedded in the optical transceiver module 10, therefore users are allowed to be free from concerns about temperature properties of the LD 2 and APD 3. Accordingly, it has been a general configuration upon usage of an optical module 1 according to the related art that the optical module 1 is previously mounted in the optical transceiver module 10.

An example of a device including such an optical module includes: a low-cost optical transmitter (for example, see WO 2002/069464) that can control with high accuracy a variation in optical output properties of semiconductor light emitting elements due to such as change in temperature; an APD bias voltage control circuit (for example, see Japanese Patent Application Laid-Open (JP-A) No. 2002-84235) that allows for a general combination of an light receiving module and an APD bias voltage controller so that the APD bias voltage controller may be provided outside the light receiving module, thus making the light receiving module smaller and a PIN element light receiving module configured together with the light receiving module; and an optical transmitter module (for example, see JP-A No. 2006-156808) that can be effectively manufactured.

The optical transceiver modules listed above have an advantage of being capable of packaging their functions in one hand, but they, in the other hand, also have a disadvantage of difficulty in cost saving due to following reasons:

Firstly, the number of parts is difficult to reduce,

Secondly, the number of equipment required to adjust and test the optical transceiver module 10 is difficult to reduce, and Finally, the number of man-hours required to adjust and test the optical transceiver module 10 is difficult to reduce.

SUMMARY

The present invention has been made in view of the above circumstances and an exemplary object of the invention is to provide an optical module, a host board, and a method of manufacturing the host board where the number of man-hours required for manufacture has been reduced.

Exemplary aspects of the present invention include the following features.

<Optical Module>

An optical module according to an exemplary aspect of the present invention includes a light emitting element, a light receiving element, and a memory circuit that stores property data associated with a property of the light emitting element and the light receiving element.

<Host Board>

A host board according to an exemplary aspect of the present invention includes an optical module including a light emitting element, a light receiving element, and a memory circuit that stores property data associated with a property of the light emitting element and the light receiving element, and a first control circuit that controls the light emitting element and the light receiving element based on the property data when the optical module is mounted on the host board.

<Method of Manufacturing Host Board>

A method of manufacturing a host board according to an exemplary aspect of the present invention includes a step of preparing an optical module including a light emitting element, a light receiving element, and a memory circuit that stores property data associated with a property of the light emitting element and the light receiving element; a step of preparing a board for the host board including a first control circuit that controls the light emitting element and the light receiving element based on the property data when the optical module is mounted on the host board and a second control circuit that controls an output of the light emitting element based on an output of the light receiving element; and a step of mounting the optical module on the board.

BRIEF DESCRIPTION OF THE DRAWINGS

FIG. 1 is a view illustrating an exemplary optical module and an exemplary host board that are manufactured by a method of manufacturing a host board according to the present invention.

FIG. 4 shows an example of property data stored in a memory area of a memory circuit 4 shown in FIG. 1.

FIG. 5 is an explanation view illustrating another example of the property data of FIG. 4 stored in the memory area of the memory circuit shown in FIG. 1.

FIG. 9 is an explanation view illustrating the number of man-hours required for the optical transceiver module according to the related art.

FIG. 10 is an explanation view illustrating the number of man-hours required for a configuration according to the present invention.

EXEMPLARY EMBODIMENT

Figure 2:
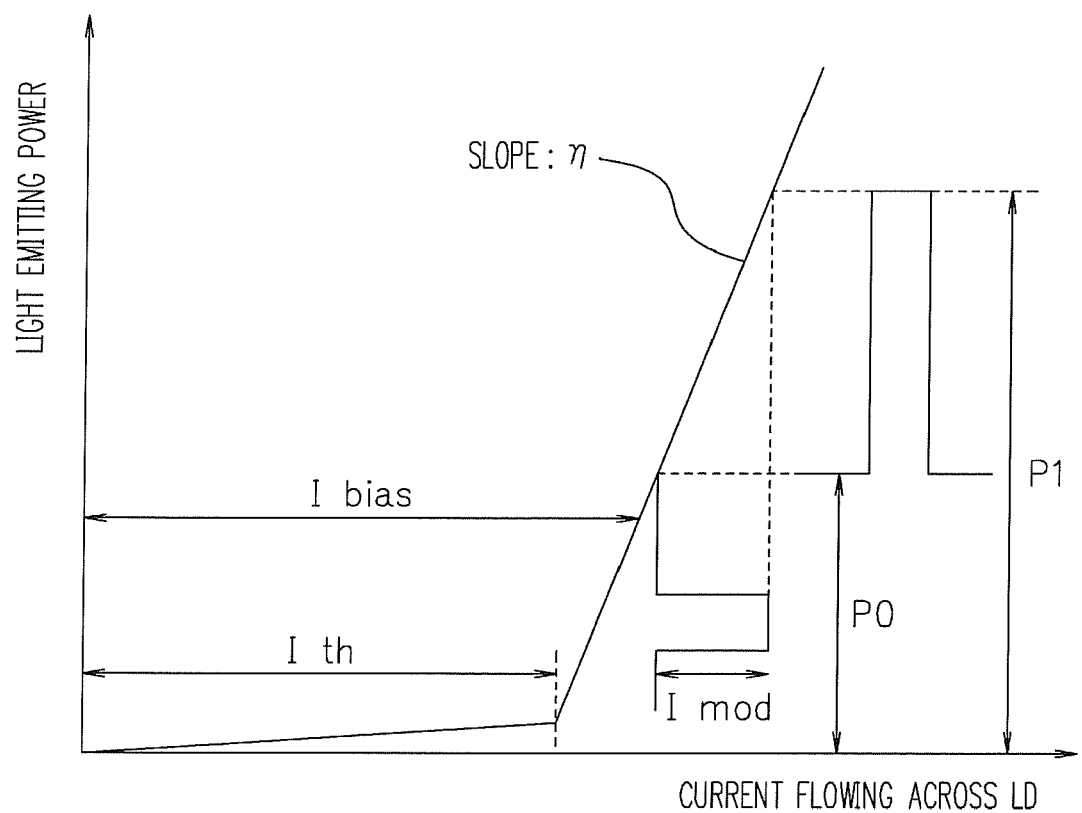
FIG. 2 is a graph illustrating a property of a general laser diode (LD).

The present invention can perform an automatic control that corresponds to property data of the LD 2 and APD 3 on the host board 8 by mounting a memory circuit 4 on the optical module 1. Accordingly, it can be not necessary to provide such type of optical transceiver module 10 as the related art.

According to the present invention, an exemplary optical module 1 includes a light emitting element, a light receiving element, and a memory circuit storing property data associated with properties of the light emitting element and the light receiving element.

The light emitting element may include, for example, a laser diode and a photo diode.

The light receiving element may include, for example, an avalanche photo diode, a photo diode, and a photo transistor.

The memory circuit may include, for example, a ROM, a RAM, and a flash memory.

According to the above configuration where the optical module includes the light emitting element, the light receiving element, and the memory circuit storing the property data associated with the properties of the light emitting element and the light receiving element, the optical module can perform an automatic control corresponding to the property data of the light emitting element and the light receiving element in the host board. As a consequence, it is not necessary to provide such type of optical transceiver module like the host board as the related art. It may be possible to provide a host board and a method of manufacturing the host board, in which the number of man-hours required for manufacture has been reduced, by using such an optical module.

A host board according to an exemplary embodiment of the present invention includes an optical module including a light emitting element, a light receiving element, and a memory circuit storing property data associated with properties of the light emitting element and the light receiving element; and a first control circuit that controls the light emitting element and the light receiving element based on the property data when the optical module is mounted on the host board.

The control circuit may include, for example, a microprocessor.

According to the above configuration where the host board includes the optical module including the light emitting element, the light receiving element, and the memory circuit storing the property data associated with the properties of the light emitting element and the light receiving element, and the first control circuit that controls the light emitting element and the light receiving element based on the property data when the optical module is mounted on the host board, the host board can perform an automatic control corresponding to the property data of the light emitting element and the light receiving element. Accordingly, any previous adjustment and such type of optical transceiver module like the host board as the related art are not necessary. As a result, it may be possible to provide a host board and a method of manufacturing the host board in which the number of man-hours required for manufacture has been reduced.

A host board according to another exemplary embodiment of the present invention includes an optical module including a light emitting element, a light receiving element, and a memory circuit storing property data associated with properties of the light emitting element and the light receiving element; a first control circuit that controls the light emitting element and the light receiving element based on the property data when the optical module is mounted on the host board; and a second control circuit that controls the output of the light emitting element based on the output of the light receiving element.

According to the above configuration where the host board includes the optical module including the light emitting element, the light receiving element, and the memory circuit storing the property data associated with the properties of the light emitting element and the light receiving element, the first control circuit that controls the light emitting element and the light receiving element based on the property data when the optical module is mounted on the host board, and the second control circuit that controls the output of the light emitting element based on the output of the light receiving element, the host board can perform an automatic control corresponding to the property data of the light emitting element and the light receiving element. Accordingly, it is not necessary to provide such type of optical transceiver module like the host board as the related art. As a result, any previous adjustment is not necessary, and a host board and a method of manufacturing the host board in which the number of man-hours required for manufacture has been reduced can be provided.

In a host board according to the other exemplary embodiment of the present invention, in addition to the above configuration, the first control circuit can calculate parameters that control the light emitting element and the light receiving element in real time.

According to the above configuration where the first control circuit calculates the parameters which control the light emitting element and the light receiving element in real time, any previous adjustment is not necessary, thus enabling efficient manufacture of the host board.

In a host board according to the other exemplary embodiment of the present invention, in addition to the above configuration, the first control circuit includes a conversion efficiency S as a parameter.

According to the above configuration where the first control circuit includes the conversion efficiency S as the parameter, any previous adjustment is not necessary, thus enabling efficient manufacture of the host board.

A method of manufacturing a host board according to an exemplary embodiment of the present invention includes a step of preparing an optical module including a light emitting element, a light receiving element, and a memory circuit that stores property data associated with properties of the light emitting element and the light receiving element; a step of preparing a board for the host board including a first control circuit that controls the light emitting element and the light receiving element based on the property data when the optical module is mounted on the host board and a second control circuit that controls the output of the light emitting element based on the output of the light receiving element; and a step of mounting the optical module on the board.

According to the above configuration where the method of manufacturing a host board includes the step of preparing the optical module including the light emitting element, the light receiving element, and the memory circuit storing property data associated with properties of the light emitting element and the light receiving element; the step of preparing the board for the host board including the first control circuit that controls the light emitting element and the light receiving element based on the property data when the optical module is mounted on the host board and the second control circuit that controls the output of the light emitting element based on the output of the light receiving element; and the step of mounting the optical module on the board, the host board including the optical module mounted thereon can perform an automatic control corresponding to the property data of the light emitting element and the light receiving element. Accordingly, it is not necessary to provide such type of optical transceiver module like the host board as the related art. As a result, any previous adjustment is not necessary, and it is possible to provide a host board and a method of manufacturing the host board, where the number of man-hours required for manufacture has been reduced.

The above exemplary embodiments of the present invention are only an example of exemplary embodiments of the present invention, and the present invention is not limited thereto. Accordingly, various modifications of the present invention may be made without departing from the broader spirit and scope of the present invention.

Effects

According to the present invention, the host board can perform an automatic control corresponding to property data of the light emitting element and the light receiving element when the optical module is mounted on the host board by including the memory circuit in the optical module. Accordingly, it is not necessary to provide such type of optical transceiver module like the host board as the related art. As a result, it is possible to provide an optical module, a host board, and a method of manufacturing the host board where the number of man-hours required for manufacture has been reduced.

Exemplary Embodiment 1

The optical module, the host board, and the method of manufacturing the host board according to the present invention, do not require previous adjustment. The optical module includes either or both of the LD (Laser Diode) or/and APD (Avalanche Photo Diode), and can automatically perform a temperature control on a host board 8 without any previous adjustment of a circuit that controls the LD or PD.

FIG. 1 is a view illustrating an exemplary optical module and an exemplary host board that are manufactured by the method of manufacturing the host board according to the present invention.

Referring to FIG. 1, the optical module 1 includes an LD 2, an APD 3, and a memory circuit 4. The memory circuit 4 previously stores property data associated with properties of the LD 2 and APD 3.

A control circuit 5 arranged on the host board 8 reads data associated with properties of the LD 2 and APD 3 from a memory area of the memory circuit 4 included in the optical module 1, and automatically controls a laser driver 6 and a driving circuit (for example, boost-up circuit) 7 to obtain targeted optical output power and light receiving sensitivity.

That is, the control circuit 5 arranged on the host board 8 controls the laser driver 6 and the boost-up circuit 7 automatically using the property data associated with the LD 2 and APD 3 stored in the memory area of the memory circuit 4, so that any previous adjustment for temperature of the LD 2 and APD 3 is not required.

Hereinafter, a method of controlling an optical module according to the present invention will be described with reference to FIG. 1.

The optical module 1 includes the LD 2, the APD 3, and the memory circuit 4. The property data related to properties of the LD 2 and the APD 3 are previously stored in the memory area of the memory circuit 4. The property data of the LD 2 includes current-to-optical conversion efficiency $\eta$, a light emitting critical value Ith, and temperature variation properties thereof. The property data of the APD 3 includes optical-to-current conversion efficiency S, a break-down voltage Vbr, and temperature variation properties thereof. The laser driver 6 drives the LD 2.

The laser driver 6 conducts a modulation current Imod and a bias current Ibias to the LD 2, so that the LD 2 be driven with desired optical output power and extinction ratio.

The control circuit 5, which serves as a first control circuit, determines the modulation current Imod and the bias current Ibias based on the property data, such as current-to-optical conversion efficiency $\eta$ and the light emitting critical value Ith, related to the LD 2 read from the memory area of the memory circuit 4.

The boost-up circuit 7 generates a reverse bias voltage Vbias of the APD 3. The APD 3 determines the light receiving efficiency and the light receiving sensitivity properties based on the reverse bias voltage Vbias of the APD 3. An optimum reverse bias voltage Vbias depends on the properties of the APD 3. The control circuit 5 determines the reverse bias voltage Vbias based on the property data related to the APD 3, such as the optical-to-current conversion efficiency S and the break-down voltage Vbr, read from the memory area of the memory circuit 4.

Descriptions of Operations of the Exemplary Embodiment

Hereinafter, an operation of the host board according to the present invention will be described.

The property data associated with properties of the LD 2 and the APD 3 are previously stored in the memory area of the memory circuit 4 shown in FIG. 1.

FIG. 2 is a graph illustrating properties of a general laser diode (LD), where a horizontal axis represents current flowing across the LD and a vertical axis represents light emitting power. Referring to FIG. 2, the light emitting power and extinction ratio have such a relationship as following equations (1) to (4):

$$P1 = \eta \times (Imod + Ibias - Ith) \tag{1}$$

where, it is assumed that the amount of light caused by the light emitting critical value Ith is small enough to be negligible.

$$P0 = \eta \times (Ibias - Ith) \tag{2}$$

where, it is assumed that the amount of light caused by the light emitting critical value Ith is small enough to be negligible.

$$Pave = (P1 + P0)/2 \tag{3}$$

$$ER = P1/P0 = Imod/(Ibias - Ith) \tag{4}$$

where, it is assumed that the amount of light caused by the light emitting critical value Ith is small enough to be negligible.

Here, Pave represents average light output power, ER represents an extinction ratio, Imod represents a modulation current flowing across the LD, Ibias represents a bias current flowing across the LD, Ith represents a light emitting critical value of the LD, and "η" represents a current-to-optical conversion efficiency of the LD.

Further, the optical module, which generally includes the LD, also includes a photo diode (monitor diode) that monitors light emitting power of the LD. The light emitting power is in proportion with the current flowing across the monitor PD, and therefore, the average light output power Pave may be calculated by measuring the monitor current.

Here, assuming the current flowing across the monitor PD is represented as Imon when a prescribed light emitting power is represented as Pa, a driving current (=Imod+Ibias) required to acquire the light emitting power Pave may be represented as following equation (5):

$$Imod/2+Ibias=Pave/Pa \times Imon+Ith \quad (5)$$

That is, if the η, the Ith and the Imon as the property data of the optical module including the LD are known, it can be possible to determine the current conditions, such as the Imod and the Ibias, required to set to the targeted light emitting power Pave and extinction ratio ER.

Since the η, the Ith, and the Imod vary with temperature, property data corresponding to temperature need to be previously obtained. The information, such as the η, the Ith, and the Imon, are stored in the memory area of the memory circuit 4 shown in FIG. 1, and therefore, the control circuit can automatically determine the optimum Imod and Ibias corresponding to temperature from the property data read from the memory circuit 4 on the host board 8.

Practically, since the temperature environments of the host board 8 do not comply with the temperature conditions of the property data stored in the memory area, it is needed to separately yield an equation having a temperature T as a parameter. The parameter can be defined by the following equations (6) and (7), where f( ) and g( ) represent functions.

$$Imod=f(\eta, Ith, Imon, Pa, Pave, ER, T) \quad (6)$$

$$Ibias=g(\eta, Ith, Imon, Pa, Pave, ER, T) \quad (7)$$

Figure 3:
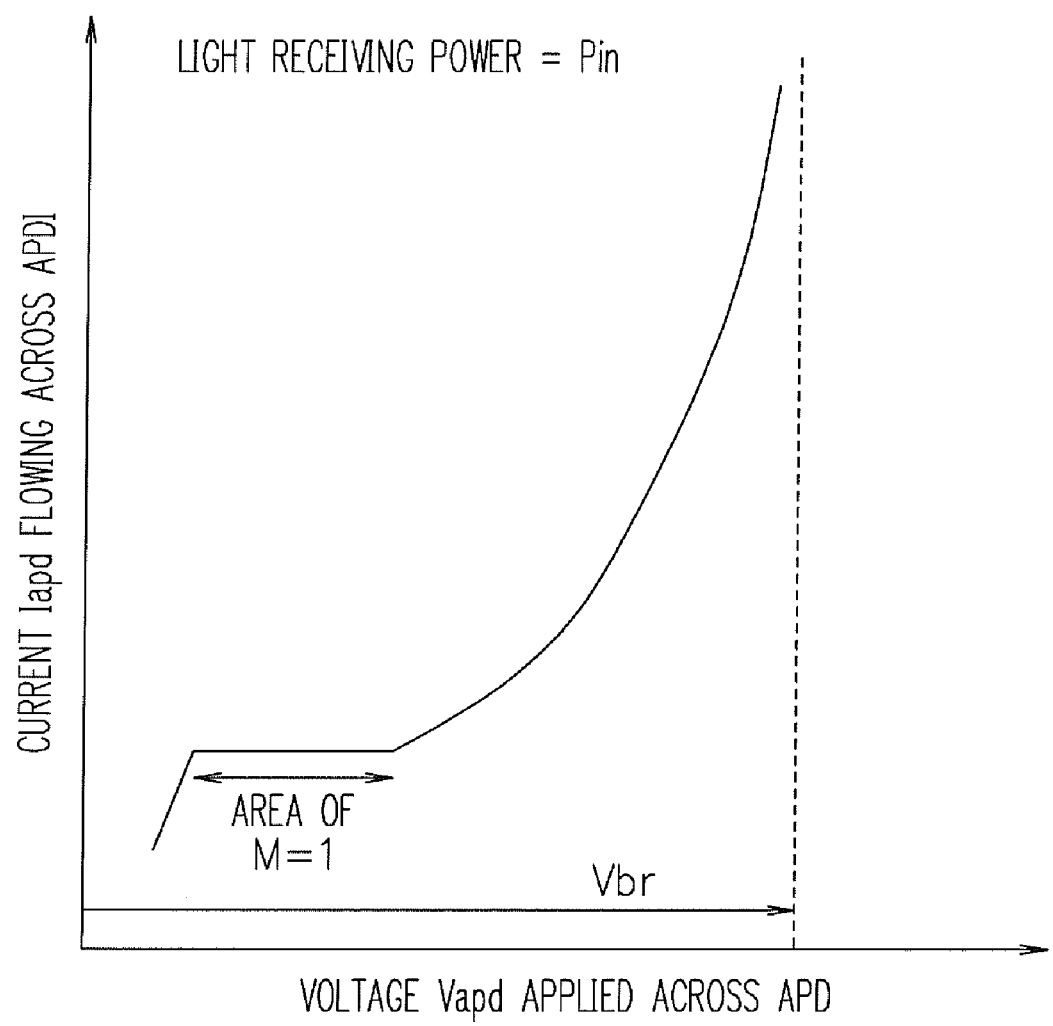
FIG. 3 is a graph illustrating a property of a general avalanche photo diode (APD).
Figure 6:
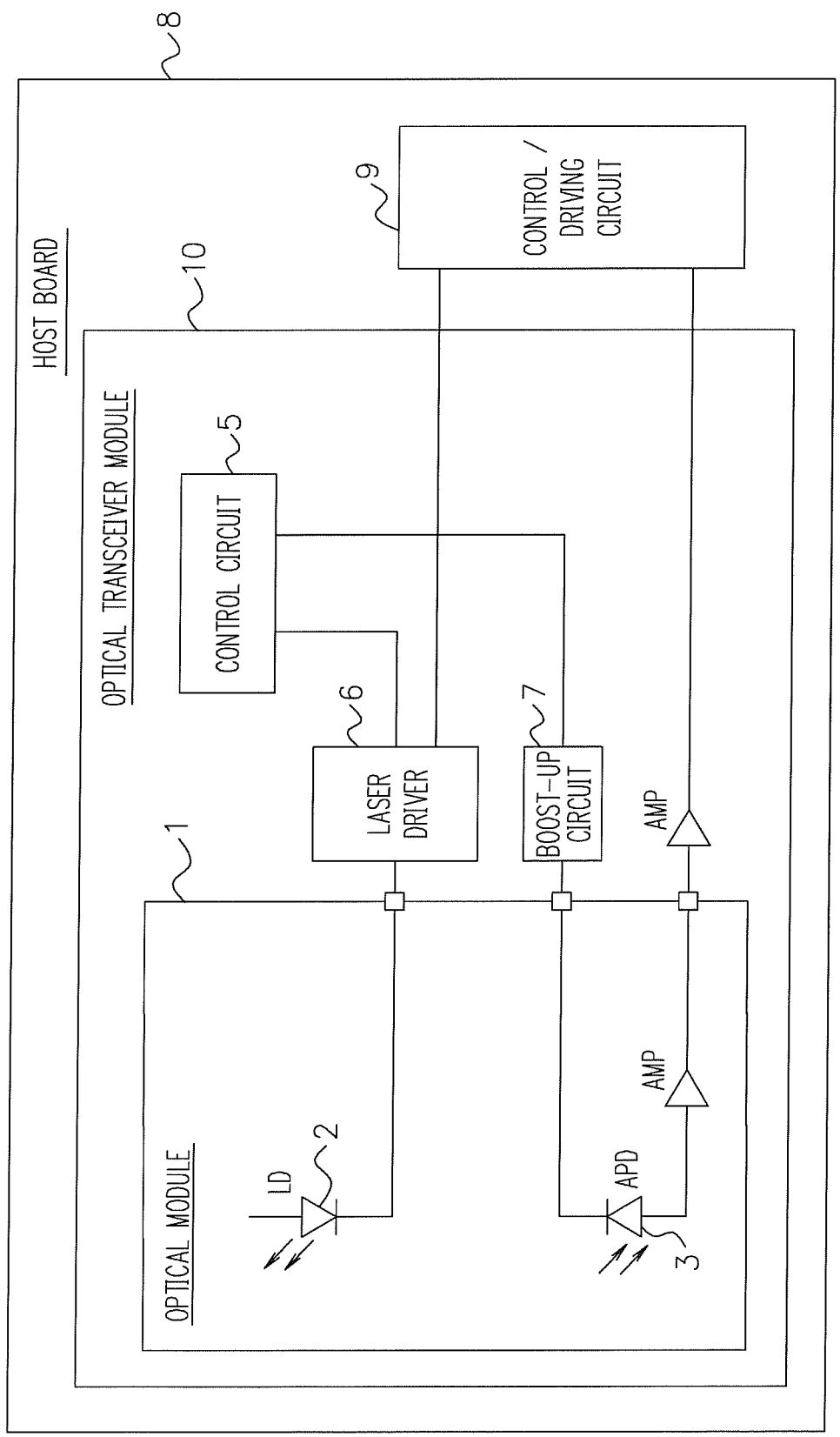
FIG. 6 is a view illustrating a configuration of a host board according to the related art.

FIG. 3 is a graph illustrating properties of a general avalanche photo diode (APD).

In FIG. 3, the horizontal axis represents a reverse bias voltage Vbias that is applied across the APD, and the vertical axis represents a current Iapd that flows across the APD.

Among the property parameters of the optical module including the APD, the conversion efficiency S and the breakdown voltage Vbr become key parameters for determining the properties of the optical module. The conversion efficiency S means an optical-to-current conversion efficiency when an increasing magnification M of the APD is 1. The current Iapd of the APD is determined by the following equation (8):

$$Iapd=M \times S \times Pin \quad (8)$$

where, Pin represents light receiving power. The increasing magnification M may be determined by the applied voltage Vbr.

In brief, if the conversion ratio S and the Vbr are known, Vbias may be determined, which is required to set to the targeted light receiving current Iapd.

Since the relationship between the M and the Vpad vary with temperature, property data corresponding to temperature need to be previously obtained. The information, such as the M and the Vpad, are stored in the memory area of the memory circuit 4 shown in FIG. 1, and therefore, the control circuit may automatically determine the optimum Vbias corresponding to temperature from the property data read from the memory circuit 4 on the host board 8.

Practically, since the temperature environments of the host board 8 do not comply with the temperature conditions of the property data stored in the memory area, it is needed to separately yield an equation having a temperature T as a parameter. The parameter may be defined by the following equation (9), where h( ) represents a function:

$$Vbias=h(S, Vbr, T) \quad (9)$$

FIG. 4 is an example of property data stored in a memory area of the memory circuit shown in FIG. 1.

Here, the temperature properties contain some representative temperature conditions obtained. The host board 8 may read the property data and the temperature of each data can be obtained through interpolation. The control circuit 5 shown in FIG. 1 extracts parameters necessary to control the LD 2 and the APD 3 automatically by storing the temperature properties of the property data in the memory area of the memory circuit 4.

[Descriptions of Effects]

According to a first effect of the present invention, any previous adjustment and test of the LD and the APD are not required.

According to a second effect of the present invention, the temperature of the LD and the APD may be controlled without packaging the optical module including the LD and the APD into a functional module, such as an optical transceiver module.

According to a third effect of the present invention, any LD and APD may be adjusted on the host board since the LD and the APD are not previously adjusted.

Exemplary Embodiment 2

FIG. 5 is an explanation view illustrating another example of the property data of FIG. 4 stored in the memory area of the memory circuit shown in FIG. 1. The memory circuit stores each of the parameters including the η, the Ith, the Imod, the S, and the Vbr as functions for temperature properties.

The same effects as those in the exemplary embodiment 1 may be obtained by the data configured as above.

In the meantime, although the optical module including both the LD and the APD has been described in the exemplary embodiment, the present invention is not limited thereto. The same effects as those in the exemplary embodiment may be achieved even by an optical module including the LD alone or optical module including the APD alone.

Table 1 shows a comparison in the number of parts between the configuration of the optical module of the related art and the configuration of the optical module according to the exemplary embodiment of the present invention.

In the configuration of the optical module according to the exemplary embodiment of the present invention, the number of parts included in the memory circuit 4 increases, but the tool parts and printed circuit board composing the optical transceiver module 10 are not required. Generally, the price of the memory circuit 4 is considerably low compared to the tool parts and printed circuit board comprising the optical transceiver module 10, and therefore, the exemplary embodiment of the present invention may save costs of members.

TABLE 1

| Key members | Configuration according to the related art | Configuration according to the present invention |
|---|---|---|
| case for optical module 1 | ○ | ○ |
| LD 2 | ○ | ○ |
| APD 3 | ○ | ○ |
| memory circuit 4 | X | ○ |
| tool parts for optical transceiver module 10 | ○ | X |
| printed circuit board for optical transceiver module 10 | ○ | X |
| control circuit 5 | ○ | ○ |
| laser driver 6 | ○ | ○ |
| boost-up circuit 7 | ○ | ○ |
| control/driving circuit 9 | ○ | ○ |

Figure 7:
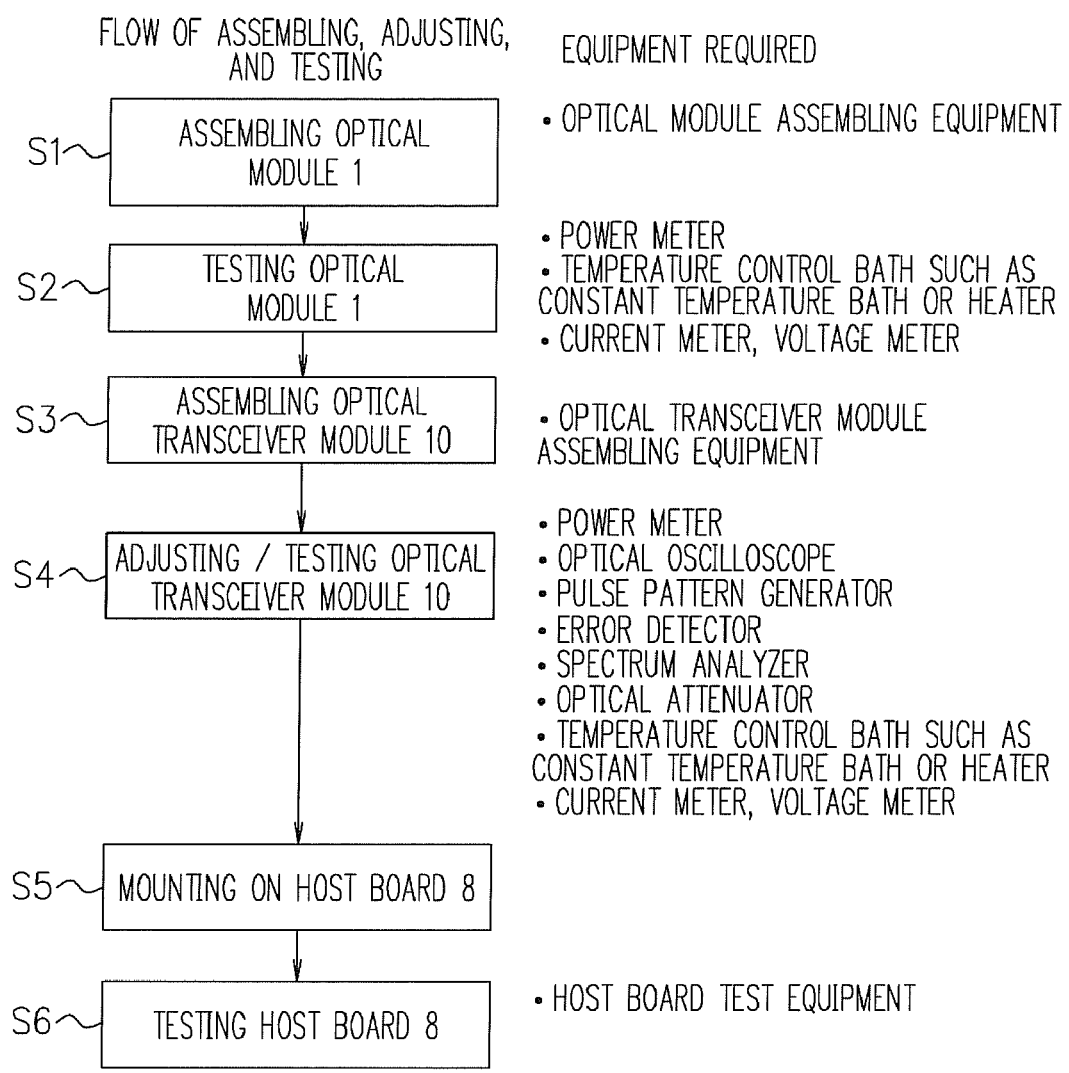
FIG. 7 is an explanation view illustrating a configuration of test and equipment required for an optical transceiver module according to the related art.

FIG. 7 shows a configuration of test and equipment required for an optical transceiver module according to the related art.

In FIG. 7, optical module assembling equipment is needed for step S1 of assembling the optical module 1.

A power meter, a temperature control bath, such as a constant temperature bath or heater, a current meter, and a voltage meter are needed for step S2 of testing the optical module 1.

Optical transceiver module assembling equipment is needed for step S3 of assembling the optical transceiver module 10.

A power meter, an optical oscilloscope, a pulse pattern generator, an error detector, a spectrum analyzer, an optical attenuator, a temperature control bath such as a constant temperature bath or heater, a current meter, and a voltage meter are needed for step S4 of adjusting/testing the optical transceiver module 10.

Through step S5 of mounting the optical transceiver module 10 on the host board 8, host board test equipment is needed for step S6 of testing the host board 8.

Figure 8:
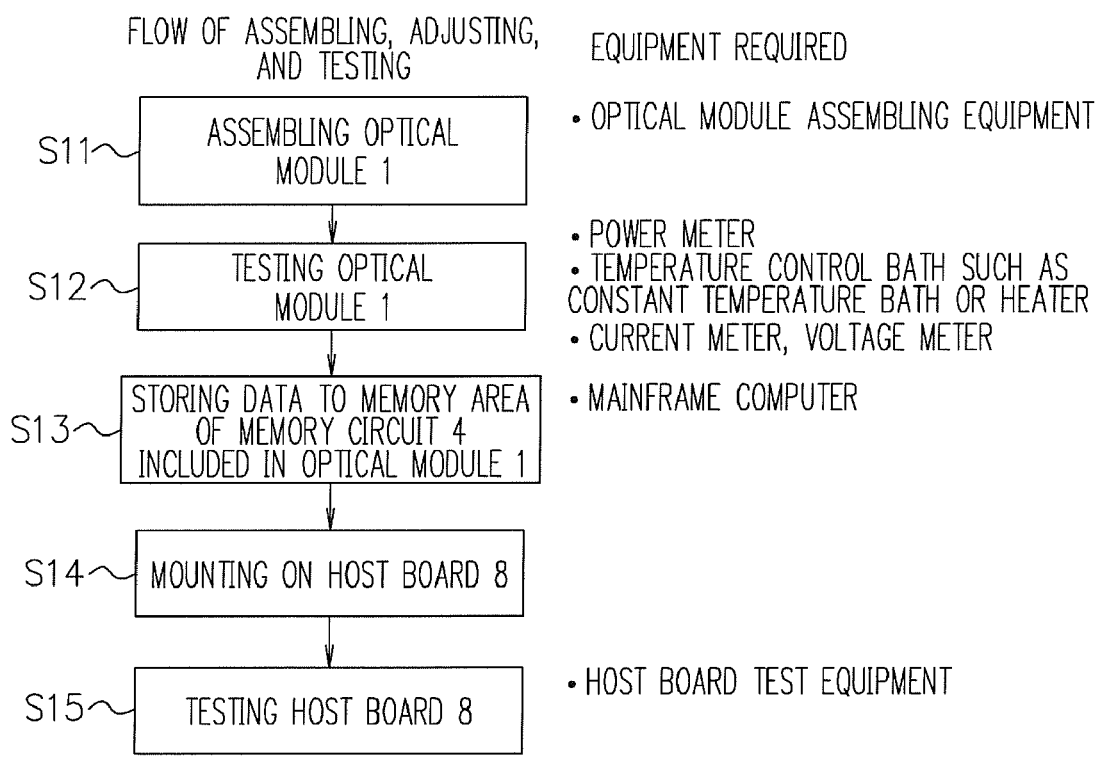
FIG. 8 is an explanation view illustrating a configuration of test equipment required for a configuration of the optical module according to the present invention.

Subsequently, FIG. 8 shows a configuration of test equipment required for a configuration of the optical module according to the present invention.

In FIG. 8, optical module assembling equipment is needed for step S11 of assembling the optical module 1.

A power meter, a temperature control bath such as a constant temperature bath or heater, a current meter, and a voltage meter are needed for step S12 of testing the optical module 1.

A mainframe computer is needed for step S13 of storing data to a memory area of the memory circuit 4 included in the optical module 1.

Through step S14 of mounting the optical module 1 on the host board 8, host board test equipment is needed for step S15 of testing the host board 8.

It can be seen from FIGS. 7 and 8 that the configuration according to the exemplary embodiment of the present invention does not require equipment for testing the optical transceiver module differently from the configuration according to the related art. In the configuration according to the exemplary embodiment of the present invention, the number of work necessary for storing data to the memory area of the memory circuit 4 increases, but such work may be performed by the mainframe computer, resulting in reducing the number of equipment by the exemplary embodiment of the present invention.

FIG. 9 shows the number of man-hours required for the optical transceiver module according to the related art.

In FIG. 9, the "assembling of an optical module: A" is needed for step S1 of assembling the optical module 1.

The "testing of the optical module 1: B" is needed for step S2 of testing the optical module 1.

The "assembling of an optical transceiver module: C" is needed for step S3 of assembling the optical transceiver module 10.

The "adjusting of the optical transceiver module 10: D" and the "testing of the optical transceiver module 10: E" are needed for step S4 of adjusting/testing the optical transceiver module 10.

The "mounting on the host board 8: F" is needed for step S5 of mounting on the host board 8.

The "testing of a host board: G" is needed for step S6 of testing the host board 8.

FIG. 10 shows the number of man-hours required for a configuration according to the present invention.

In FIG. 10, the "assembling of an optical module: A" is needed for step S11 of assembling the optical module 1.

The "testing of the optical module 1: B" is needed for step S12 of testing the optical module 1.

The "storing of data: Z" is needed for step S13 of storing data to the memory area of the memory circuit 4 included in the optical module 1.

The "mounting on the host board 8: F" is needed for step S14 of mounting on the host board 8.

The "testing of the host board 8: G+H" is needed for step S15 of testing the host board 8.

It can be seen from FIG. 9 that the optical transceiver module according to the related art requires the number of man-hours equal to A+B+C+D+E+F+G. However, from FIG. 10, the configuration according to the exemplary embodiment of the present invention requires the number of man-hours equal to A+B+F+G+H+Z, and therefore, the difference in the number of man-hours from the related art corresponds to C+D+E−H−Z.

Here, since it is generally satisfied that C+D+E>H+Z, the number of man-hours required may be reduced in the exemplary embodiment of the present invention.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A host board comprising:
   an optical module including:
      a light emitting element,
      a light receiving element, and
      a memory circuit that stores property data associated with a property of the light emitting element and the light receiving element, the property data including a current-to-optical conversion efficiency, a light emitting critical value, and temperature variation properties for the light emitting element, and an optical-to-current conversion efficiency, a breakdown voltage, and temperature variation properties for the light receiving element; and
   a first control circuit that controls the light emitting element and the light receiving element based on the property data when the optical module is mounted on the host board,
   wherein the first control circuit is to provide a modulation current and a bias current to the light emitting element, based on the current-to-optical conversion efficiency, the light emitting critical value, and the temperature variation properties for the light emitting element stored in the memory circuit, and also based on a desired optical output power and a desired extinction ratio of the light emitting element, wherein the first control circuit is further to generate a reverse bias voltage of the light receiving element based on the optical-to-current conversion efficiency, the breakdown voltage, and the temperature variation properties for the light receiving element stored in the memory circuit, wherein the memory circuit, the light emitting element, and the light receiving element are all mounted on and are part of the optical module, whereas the first control circuit is not part of the optical module but rather is connected to the optical module on the host board, and wherein no adjustment of the optical module is necessary for the optical module to function.

2. The host board of claim 1, further comprising:
a second control circuit that controls an output of the light emitting element based on an output of the light receiving element.

3. The host board of claim 1, wherein
the first control circuit calculates a parameter that controls the light emitting element and the light receiving element in real time.

4. The host board of claim 1, wherein
the first control circuit includes a conversion efficiency S as a parameter.

5. A method of manufacturing a host board comprising:
a step of preparing an optical module including a light emitting element, a light receiving element, and a memory circuit that stores property data associated with a property of the light emitting element and the light receiving element, the property data including a current-to-optical conversion efficiency, a light emitting critical value, and temperature variation properties for the light emitting element, and an optical-to-current conversion efficiency, a breakdown voltage, and temperature variation properties for the light receiving element;

a step of preparing a board for the host board including a first control circuit that controls the light emitting element and the light receiving element based on the property data when the optical module is mounted on the host board and a second control circuit that controls an output of the light emitting element based on an output of the light receiving element; and a step of mounting the optical module on the board, wherein the first control circuit is to provide a modulation current and a bias current to the light emitting element, based on the current-to-optical conversion efficiency, the light emitting critical value, and the temperature variation properties for the light emitting element stored in the memory circuit, and also based on a desired optical output power and a desired extinction ratio of the light emitting element, wherein the first control circuit is further to generate a reverse bias voltage of the light receiving element based on the optical-to-current conversion efficiency, the breakdown voltage, and the temperature variation properties for the light receiving element stored in the memory circuit, wherein the memory circuit, the light emitting element, and the light receiving element are all mounted on and are part of the optical module, whereas the first control circuit is not part of the optical module but rather is connected to the optical module on the host board, and wherein no adjustment of the optical module is necessary for the optical module to function.

* * * * *